Oct. 10, 1967 N. C. HEKIMIAN 3,346,805

VARIABLE T-NETWORK ATTENUATOR USING VARACTOR DIODES

Filed Sept. 18, 1964

INVENTOR
NORRIS C. HEKIMIAN
BY John J. Byrne
ATTORNEY

United States Patent Office 3,346,805

Patented Oct. 10, 1967

3,346,805

VARIABLE T-NETWORK ATTENUATOR USING VARACTOR DIODES

Norris C. Hekimian, Kensington, Md., assignor to Page Communications Engineers, Inc., Washington, D.C., a corporation of Delaware Filed Sept. 18, 1964, Ser. No. 397,442
3 Claims. (Cl. 323—74)

This invention relates generally to attenuators and more specifically to voltage variable attenuators using varactor diodes.

One of the primary purposes of the present invention is to provide a voltage controlled attenuator which will operate over an extremely wide control bandwidth, thus assuring uniformity of attenuation as a function of frequency and great response speed.

Additionally, the attenuator of the present device has a relatively small insertion loss, thus minimizing the pre- and post-amplification requirements.

The present attenuator also presents a high impedance input to the control line so as to minimize the required control power and permit simple low frequency RC filtering with large time constants.

The relatively simple, passive circuitry of the present invention assures stability of the attenuation characteristic with time and temperature while minimizing the required number of components and interconnections.

Figure 1:
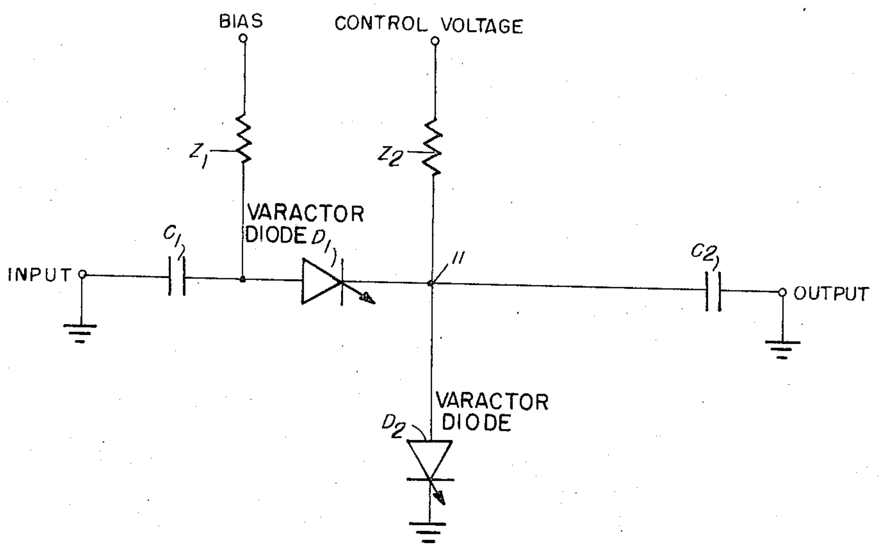
Figure 2:
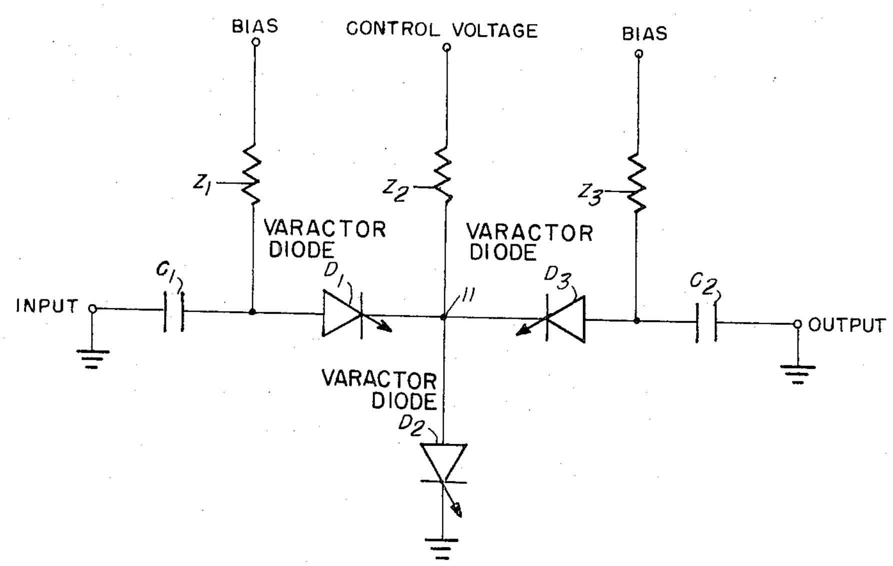

These and other advantages will be obvious from the following description when taken in conjunction with the drawings wherein:

FIG. 1 is a schematic showing of the simplified circuit common to all forms of the variable controlled attenuator of the present invention; and FIG. 2 is a schematic showing of a modification of FIG. 1.

The voltage controlled attenuator of the present invention is basically a voltage controlled capacitive divider with the unusual properties being derived from the particular circuit configuration.

Turning now specifically to FIG. 1, it will be seen that the varactor diodes D1 and D2 are used as a capacitive divider similar to a differential capacitor. Diode D1 has the anode coupled to the input terminal through capacitor C1 and the cathode coupled to the output terminal through capacitor C2. Diode D2 has the anode connected to the junction 11 between diode D1 and capacitor C2, with the cathode connected to ground. The variable control voltage is connected to the same junction through impedance Z2. Impedance Z2 is required in order to prevent the control source from short circuiting the RF signal-to-ground and similarly prevent RF signals from flowing to the control circuitry. A reverse bias is applied to the anode of diode D1 through impedance Z1 for similar reasons.

The reverse bias establishes the total voltage applied to the diode from the input terminal.

By applying a control voltage of some value between ground and the bias voltage, smooth control of the two diodes is obtained. When the control voltage is close to ground potential, the series diode D1 is heavily reverse biased since it has almost all of the bias potential across it. The shunt diode D2 is nearly zero biased under the same control voltage. Under these conditions, a large attenuation is achieved when using resistive terminations.

When the control voltage is near the bias voltage, the series diode D1 is near zero bias and the shunt diode D2 is highly reverse biased. Since the effective series capacitance is then large and the shunt capacitance is small, the attenuation is very small.

Under both of the above extreme conditions, the control line presents a high input resistance. Unless the control voltage exceeds the bias or ground potentials in magnitude, and providing the signal amplitude is not excessive, the only DC current drain will be that associated with the diode reverse currents. Such a current drain is commonly in the pico ampere range. The AC impedance, however, is not as high at the higher frequencies.

The shunting effect of coupling capacitor C2 in FIG. 1 poses a severe limitation upon both the control line driving point impedance and on the maximum speed or frequency response of the attenuation characteristic. In the simple case of a resistance for Z2, and with resistive terminations for the RF signal and load, a step change of control voltage will propagate as an RC low-pass filtered signal to the varactor diodes.

Since DC blocking is essential to permit proper biasing, the circuit of FIG. 2 shows a modification of FIG. 1 which permits the control line to feed into a node free of coupling capacitors. This is accomplished by adding varactor diode D3 with the cathode connected to the junction 11 and the anode coupled to the output terminal through capacitor C2. Diode D3 has a bias voltage applied thereto in a manner similar to the bias of D1.

In the circuit of FIG. 2, the time constants are associated only with the three varactor diodes, D1, D2 and D3, at the common node. Since these total to a much smaller capacitance than the coupling capacitor, a large reduction in time constant and a significant increase in the control line impedance is simultaneously achieved.

In the circuitry described, the control devices are varactor diodes with all of the other components being conventional lumped constant R, L and C devices.

Tests have shown that the circuit as shown in FIG. 2 has the following characteristics:

Control range: over 50 db
Insertion loss: 12 to 14 db
Control bandwidth: DC to over 5 mc.
Signal bandwidth: In excess of 50 mc. to 350 mc.

It is obvious from the above description that various modifications of the circuit will fall within the scope of the invention as set forth in the following claims.

What is claimed is:

1. A voltage controlled attenuator comprising:
an input terminal,
an output terminal,
first and second varactor diodes connected in series between said input and output terminals, said diodes being connected in opposed polarity configuration,
a third varactor diode connected in shunt configuration between said first and second diodes,
means for applying a reverse bias to said first and second diodes, and
means for applying a variable voltage to the junction between said first, second and third diodes.

2. A voltage controlled attenuator comprising:
input and output terminals,
a junction between said terminals,
a first varactor diode connected between said input terminal and said junction,
a second varactor diode connected between said junction and said ground,
said first and second diodes having opposite electrodes connected to said junction,
means for applying a reverse bias to said first diode, and
means for applying a variable voltage to said junction,
a third varactor diode connected between said junction and said output terminal, said third diode being connected to said junction in opposed polarity to that of said second diode, and means for applying a reverse bias to said third diode.

3. A voltage controlled attenuator comprising:
input and output terminals,
a pair of series connected varactor diodes poled in the opposite direction between said terminals,
a third varactor diode connected between the junction of said pair of diodes and ground,
means for reverse biasing said pair of diodes, and
means for placing a variable voltage at said junction between said pair of diodes.

References Cited

UNITED STATES PATENTS

| | | | |
|---|---|---|---|
| 2,075,957 | 4/1937 | Payne | 333—24 |
| 2,191,315 | 2/1940 | Guanella | 323—93 X |
| 3,117,293 | 1/1964 | Mortley | 307—88.5 |

FOREIGN PATENTS

| | | |
|---|---|---|
| 249,709 | 2/1964 | Australia. |

JOHN F. COUCH, *Primary Examiner.*

A. D. PELLINEN, *Assistant Examiner.*